United States Patent [19]
White

[11] Patent Number: 5,339,346
[45] Date of Patent: Aug. 16, 1994

[54] DEVICE FABRICATION ENTAILING PLASMA-DERIVED X-RAY DELINEATION

[75] Inventor: Donald L. White, Morris Plains, N.J.

[73] Assignee: AT&T Bell Laboratories, Murray Hill, N.J.

[21] Appl. No.: 65,331

[22] Filed: May 20, 1993

[51] Int. Cl.$^5$ .............................................. G21K 5/00
[52] U.S. Cl. ........................................ 378/34; 378/43; 378/85
[58] Field of Search .................. 378/34, 35, 43, 84, 378/85, 145, 146

[56] References Cited

U.S. PATENT DOCUMENTS

| | | | |
|---|---|---|---|
| 4,650,315 | 3/1987 | Markle | 359/731 X |
| 4,711,535 | 12/1987 | Shafer | 359/724 X |
| 4,734,829 | 3/1988 | Wu et al. | 385/120 X |
| 5,063,586 | 11/1991 | Jewell et al. | 378/34 |

OTHER PUBLICATIONS

W. T. Silfvast, et al., "Laser-Produced plasmas for soft x-ray projection lithography", *J. Vac. Sci. Tech.* B 106, Nov./Dec. 1992, pp. 3126–3133.

*Primary Examiner*—David P. Porta
*Attorney, Agent, or Firm*—George S. Indig

[57] ABSTRACT

Submicron device fabrication entailing ringfield x-ray pattern delineation is facilitated by use of a condenser including a faceted collector lens. The collector lens is constituted of paired facets, symmetrically placed about an axis of a laser-pumped plasma source. Each of the members of a pair produce an image of the entire illumination field so that inhomogeneities in illumination intensity are compensated within each composite image as produced by a particular pair.

17 Claims, 5 Drawing Sheets

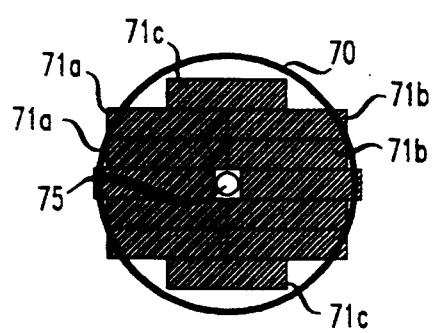
FIG. 7A
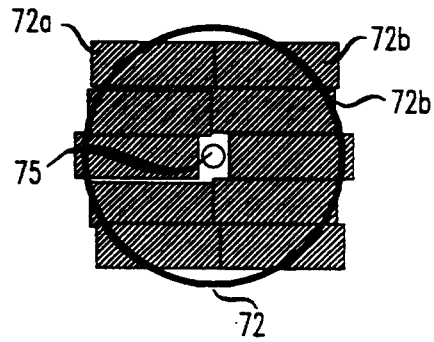
FIG. 7B
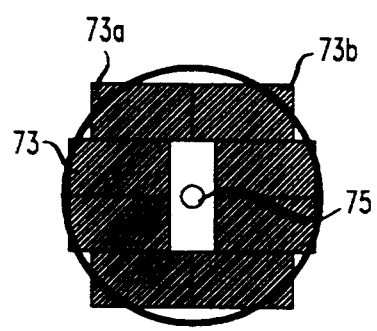
FIG. 7C
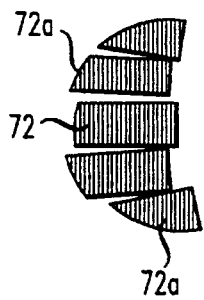
FIG. 7E
FIG. 7D
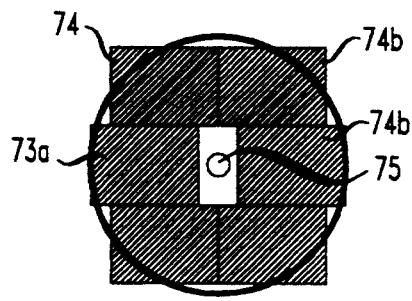
FIG. 8A

DEVICE FABRICATION ENTAILING PLASMA-DERIVED X-RAY DELINEATION

BACKGROUND OF THE INVENTION

1. Technical Field

The invention relates to fabrication of devices built to submicron design rules. Plasma-derived x-ray radiation serves for pattern delineation for small features considered unattainable by use of longer wavelength electromagnetic radiation. The plasma source is matched to a projection camera operating in a ringfield scanning mode. Very Large Scale Integration ("VLSI") is a prime objective.

2. Description of the Prior Art and of Co-pending U.S. patent application Ser. No. 08/059,924 filed May 10, 1993.

State-of-the art VLSI is a 16 megabit chip with circuitry built to design rules of 0.5 $\mu$m. Effort directed to further miniaturization takes the initial form of more fully utilizing resolution capability of presently-used ultraviolet ("UV") delineating radiation. "Deep" UV ($\lambda = 0.3$ $\mu$m$-0.1$ $\mu$m), with techniques such as phase masking, off-axis illumination, and step-and-repeat may permit design rules (minimum feature or space dimension) of 0.25 $\mu$m or slightly smaller.

At still smaller design rules, a different form of delineating radiation is required to avoid wavelength-related resolution limits. An extensive effort depends on electron or other charged-particle radiation. Use of electromagnetic radiation for this purpose will require x-ray wavelengths.

Two x-ray radiation sources are under consideration. The first, the electron storage ring synchrotron, has been used for many years and is at advanced stage of development. Electrons, accelerated to relativistic velocity, in following their magnetic-field-constrained orbit, emit x-ray radiation. Radiation, in the wavelength range of consequence for lithography, is reliably produced. The synchrotron produces precisely defined radiation to meet the demands of extremely sophisticated experimentation but is a large, very costly piece of apparatus.

Plasma x-ray sources are less costly. These depend upon a high power, pulsed laser—e.g. an yttrium aluminum garnet (YAG) laser, or an excimer laser, delivering 500–1,000 watts of power to a 50 $\mu$m–250 $\mu$m spot, thereby heating a source material to e.g. 250,000° C., to emit x-ray radiation from the resulting plasma. Plasma sources are compact, and may be dedicated to a single production line (so that malfunction does not close down the entire plant).

A variety of x-ray patterning approaches are under study. Probably the most developed is proximity printing. In this approach 1:1 imaging is produced much in the manner of photographic contact printing. A fine-membrane mask is maintained at one or a few microns spacing from the wafer. This spacing lessens likelihood of mask damage, but does not eliminate it. Making perfect masks on a fragile membrane continues to be a major problem. Necessary absence of optics in between the mask and the wafer necessitates a high level of parallelicity in the incident radiation. X-ray radiation of wavelength $\lambda \leq 16$ Å is required for 0.25 $\mu$m patterning to limit scattering at feature edges.

Use has been made of the synchrotron in proximity printing. Relatively small power resulting from the 10 mrad-20 mrad arc of collection, together with the high-aspect ratio of the emission fan, has led to use of a scanning high-aspect ratio illumination field (rather than to full-field imaging).

Projection lithography has natural advantages over proximity printing. Camera optics in between the mask and the wafer compensate for edge scattering and, so, permit use of longer wavelength radiation. Use of "soft x-ray" in the $\lambda = 100$ Å-200 Å wavelength range increases the permitted angle of incidence for glancing-angle optics. The resulting system is known as soft x-ray projection lithography (SXPL).

A favored form of SXPL is ringfield scanning. The long narrow illumination field is arc-shaped rather than straight, with the arc being a segment of the circular ring with its center of revolution at the optic axis of the camera. Use of such an arcuate field avoids radially-dependent image aberrations in the image. Use of object:image reduction of e.g. 5:1 results in significant cost reduction of the, now, enlarged-feature mask.

Co-pending U.S. patent application, Ser. No. 08/059,924 filed May 10, 1993 describes and claims device fabrication using synchrotron derived x-ray radiation. SXPL is one form of lithography described and claimed.

It is expected that effort toward adaptation of plasma x-ray sources for SXPL will continue. Design of collection and processing optics—design of the condenser-is complicated by the severe mismatch between the plasma emission pattern and that of the ringfield scan line. A typical plasma x-ray source has a 1:1 aspect ratio emission pattern. The required scan line is likely greater than 10:1.

SUMMARY OF THE INVENTION

Ringfield projection lithographic definition in the fabrication of 0.25 $\mu$m and smaller design rule devices makes use of an x-ray plasma source. Requirements for illumination uniformity, and for other characteristics of the illumination field, necessary for matching the projection camera, are met by a novel condenser. The collector lens—the condenser lens on which the plasma radiation is first incident-includes a number of pairs of facets which are symmetrically placed with respect to the plasma. Each facet collects radiation from a sector of the emission and images the entire radiation field, to produce an image intensity which is the sum of the facet intensities. Facets are complementary so that any gradation in intensity of its field image is equal and opposite to that of its twin. In this way a constant intensity field is effectively produced from essentially the entirety of the plasma emission without need for stitching. Facets may be planar or may be shaped to increase collection angle, the only requirement being that size and shape of paired members be truly complementary so as, to together, produce an evenly illuminated composite image.

Species of the invention provide for processing optics for shaping, for directing, and for adjusting divergence of the illumination field as made incident on the reflecting mask. The condenser is of appropriate design for proper pupil fill and for matching other camera requirements. The design is suitable for use with reduction projection, e.g. for 5:1 subject:image reduction.

BRIEF DESCRIPTION OF THE DRAWING

FIGS. 7a, 7b, 7c and 7d are plan views of alternative paired-facet collector lens arrangements satisfying the inventive requirements. FIG. 7e is an elevational view of FIG. 7b.

FIGS. 8a and 8b are orthogonal views of an illustrative 3-lens condenser with output successively illuminating a mask, properly filling a camera pupil, and scanning a wafer.

DEFINITIONS

Figure 1:
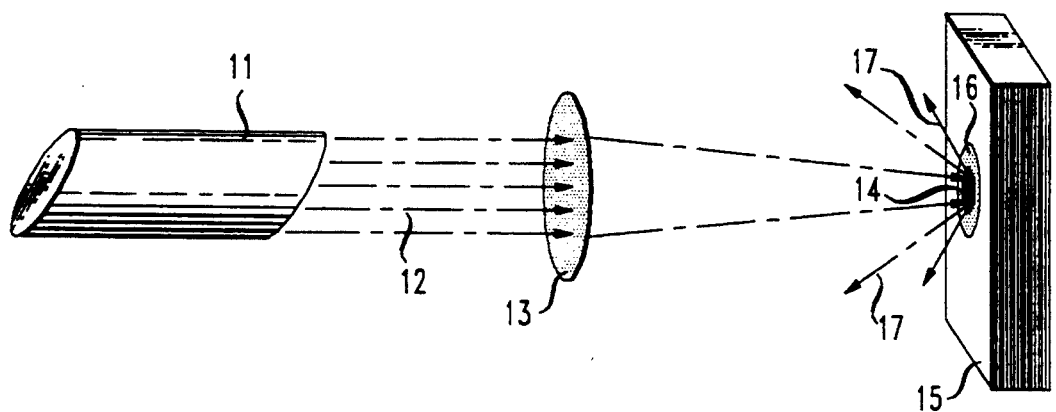
FIG. 1 shows a plasma x-ray source with pump and focusing means.

Plasma Source—A thermally-produced plasma for yielding x-ray radiation—generally pumped by a high power pulsed laser.

Illumination Radiation—The delineating radiation as incident on and producing an Illumination Field on the mask, characterized by intensity, direction, divergence and spectral width.

Divergence—As used by itself, the term refers to mask divergence, i.e., the largest angle about the axis of the cone of radiation as incident on the mask. In projection, the axis is generally a few degrees off normal incidence as required for reflection masking. The magnitude of divergence required in projection is that needed to reduce ringing at feature edges to the extent necessary for desired resolution and contrast. In full-field exposure, divergence should be similar at every illumination point. In scanning, some non-uniformity in the scanning direction may be averaged out.

Condenser—Optical system for collecting radiation from the plasma source, for processing the radiation to produce a ringfield illumination field, and for illuminating the mask.

Collecting Optics (or Collector)—The Optics within the condenser responsible for collecting the plasma-derived radiation. The collector has a focus.

Processing Optics—Optics, in addition to the collecting optics, within the condenser for processing collected radiation for delivery to the mask.

Imaging Optics—Optics following the condenser responsible for delivering mask-modulated radiation to the wafer, i.e. the camera optics.

Camera Pupil—Real or virtual aperture which defines the position through which illumination radiation must enter the camera, of angular size defining the diffraction limit of the camera. Its physical size is that of an image of the real limiting aperture of the camera.

Lens—The term is used in this description to define any optical element which causes x-ray radiation to converge or diverge. "Lenses", in x-ray systems, are generally reflecting—are sometimes referred to as "mirrors". contemplated lenses may be multi-faceted or may be non-faceted, i.e. continuous—e.g., of ellipsoidal or other curvature. The convergence or divergence is a result of action analogous to that of a transmission optical lens.

Facet—Individual segment of a lens—either a separate element, or part of a monolithic structure, which, generally in concert with other facets, is responsible for convergence or divergence of the radiation. Individual facets may be planar or curved.

Scatter Plate—Optical element for increasing divergence. Divergence may be in one or two dimensions.

DETAILED DESCRIPTION

General—There is a continuing effort directed to development of x-ray plasma sources for pattern delineation at feature sizes $\leq 0.25$ μm. See, W. T. Silfvast, M. C. Richardson, H. Binder, A. Hanzo, V. Yanovsky, F. Jin, and J. Thorpe, "*Laser-Produced Plasmas for Soft-X-ray Projection Lithography*" J. Vac. Sci. Tech. B 106, Nov./Dec. 1992, pp. 3126–3133. By its nature, emission from a plasma source is omnidirectional. Device fabrication of this invention depends upon a condenser designed to capture this omnidirectional emission and to shape it to produce a high-aspect ratio illumination field for ringfield projection lithography.

In addition to shaping, directing, and tailoring divergence, the condenser must filter the natural plasma spectrum of perhaps $\lambda = 50$ Å–400 Å to yield the favored ringfield wavelength range within a spectrum of $\lambda = 100$ Å–200 Å (at this time the preferred spectral range is $\lambda = 125$ Å–140 Å). Use of this "soft x-ray projection lithography" (SXPL) takes advantage of ability to make high reflectivity normal incidence mirrors. It also expedites use of glancing mirror optics, in permitting larger angles of incidence than those required for the "hard x-ray" used in proximity printing.

Filtration, to yield the desired x-ray spectrum, will likely use multi-layer reflectors (MLR) operating on the Distributed Bragg Reflector (DBR) principle.

The Drawing—Detailed design and processing information is discussed in conjunction with the figures.

In FIG. 1a YAG or excimer laser 11 emits a beam 12 which is focused by lens 13 to heat a spot 14 on target material 15, thereby yielding plasma ball 16 which emits x-rays 17. Radiation is emitted over an entire 180° half sphere.

Figure 2:
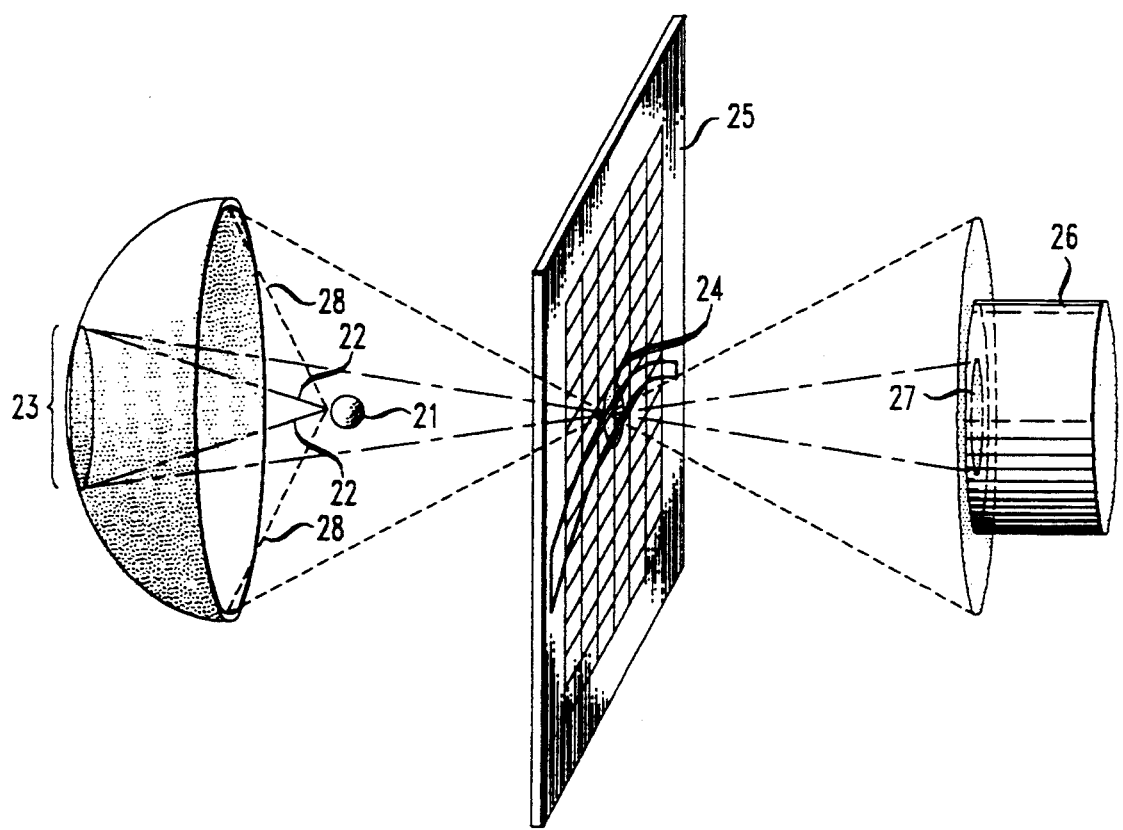
FIG. 2 shows a state-of-the-art condenser for collecting plasma radiation and for illuminating a ringfield arc on a mask for delivery to the camera pupil.

FIG. 2 is a perspective view of a state-of-the-art system for using a plasma source for powering a projection camera. Plasma source 21 emits a half sphere of x-ray radiation shown as rays 22. An MLR 23 focuses radiation at focus 24 on mask 25. The illumination field is an image of the source. As depicted, the illumination field is a spot 24 incident on mask 25, where the radiation is either transmitted or reflected to be introduced into camera 26 by partially filling entrance pupil 27. For the proper pupil fill shown only a relatively small cone of radiation is collected, and radiation outside this cone is wasted. If the size of the condenser is increased in order to collect the relatively large angle radiation represented rays 28, the camera pupil is greatly overfilled as shown by field 29, produced by the condenser-emitted rays shown as broken lines. Energy is wasted and the image is degraded. Neither arrangement produces a ringfield illumination field.

Figure 3:
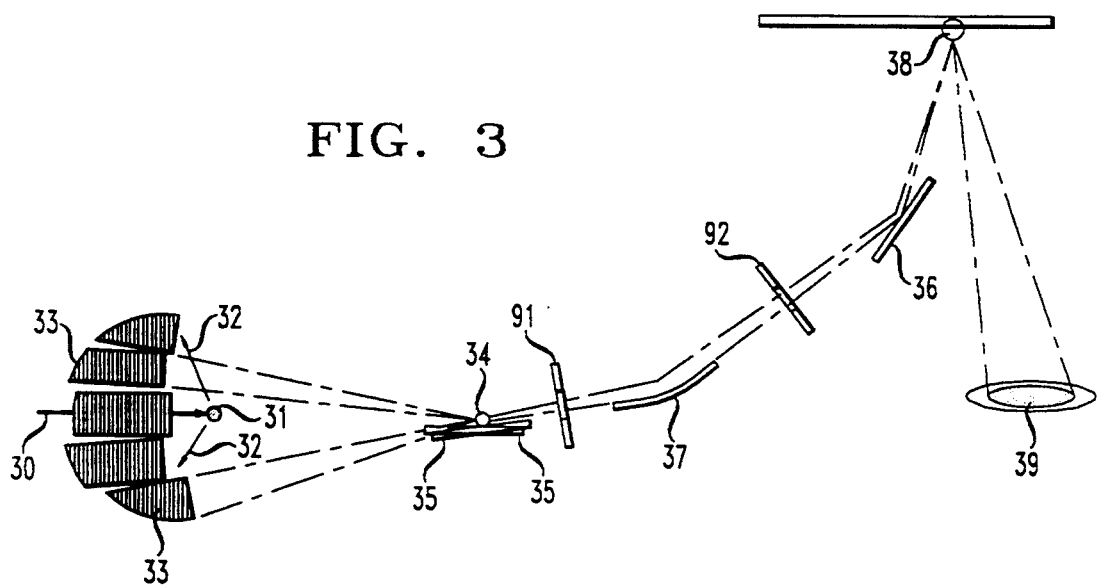
FIGS. 3 and 4 are elevational and plan views of condenser optics of the invention, showing imaging of the radial and circumferential aspects of the ringfield image.
Figure 4:
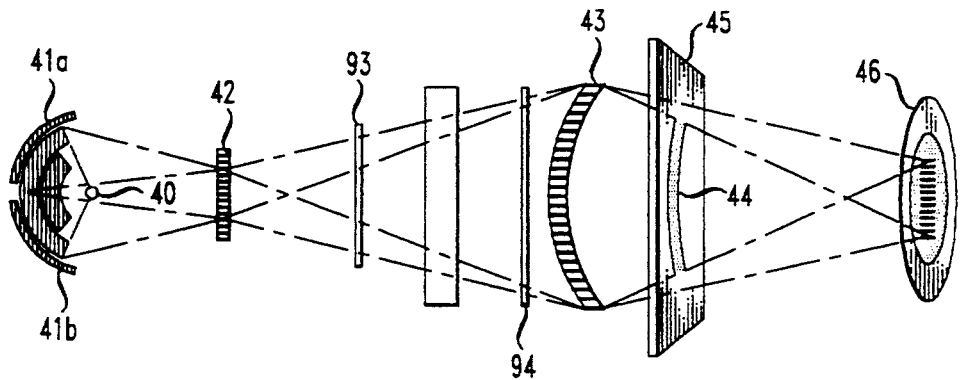

FIGS. 3 and 4 show an illustrative system for effectively producing the high-aspect ratio illumination field for ringfield projection. FIG. 3, an "elevational" view illustrates processing to deliver the short dimension of the high-aspect-ratio field. Plasma 31, produced by laser beam 30 emits x-rays 32 over a wide angle, near-half sphere, which is captured by lens facets 33. While not seen in this view, most or all of facets 33 are members of paired complementary facets, common to all collectors used in the inventive processing. An aperture can be placed in the beam path, either at position 91 or 92 in FIG. 3, (~93 or 94 in FIG. 4). The aperture can block part of the beam to produce greater uniformity in intensity on the mask, if needed. If ellipsoidal, the first focus may conveniently correspond with the source, and the second focus may correspond with the image. The curved facet surface may be of "Lopez" form. The Lopez mirror is explicity designed to produce a single focus for many-angled emission. Its use for the individual facets of the multi-faceted collector lens may be justified.

Each of the facets may be viewed as having an effective height comparable to that of mirror 23 in FIG. 2 to produce a field dimension in the scanning direction which is the same as that of a spot 24. Each of the facets focuses an image of source 31 as image 34 on lens 35. Lens 35 is a many-faceted mirror which directs reflected radiation and overlaps individual beams at processing optic 36. Mirror 37, likely a single, continuous surface, concave lens, is a redirecting optic. The several images are brought to a common focus at or near mask 38 and are directed to enter camera pupil 39.

Companion FIG. 4 shows illumination of the transverse (or long dimension) of the high-aspect-ratio ringfield. Laser plasma radiation from source 40 is collected by the array of ellipsoidal mirrors, here shown as paired facets 41a–41b. The collector focuses an image of the source to a series of spots on processing lens (mirror array) 42, with individual spots made incident on individual facets of lens 42. The facets of lens 42 are oriented such that the center ray of the reflected beam strikes the center of the processing lens 43 which is again a multi-faceted array in this example, but may be a continuous curved surface such as a cylindrical mirror or an ellipsoidal or toroidal mirror. The distance between the processing lens 42 and processing lens 43 is such that the processed radiation emitted by lens 42 covers the length of lens 43. Lens 43 in conjunction with lens 37 of FIG. 3, together, shape the beam to produce the proper arc shape illumination field 44 as incident on mask 45. The same optics introduce the convergence shown upon reflection from mask 45 to produce the desired fill of entrance pupil 46.

Figure 5:
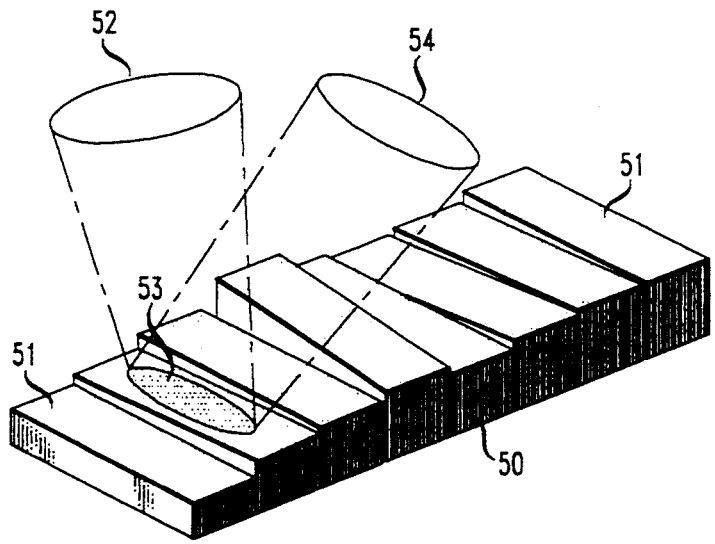
FIG. 5 is a detailed view of a processing mirror for shaping the illumination field.

The multi-faceted lens 50 shown in FIG. 5 is illustrative of optics serving the function of lens 42 of FIG. 4. Lens 50 is constituted of 8 facets 51 oriented such that incoming cones of radiation 52 are reflected as cones 54 toward the processing optics. The aspect-ratio of facets 51 may approximate that of the desired illumination field—image dimension 53 corresponding with the long dimension of facet 51.

Figure 6A:
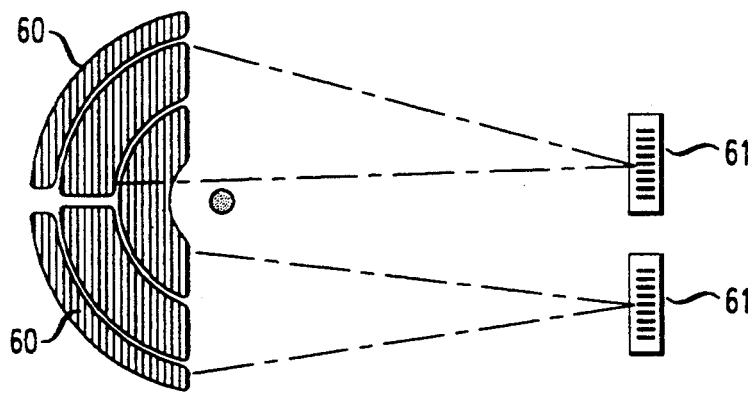
FIGS. 6a, 6b and 6c show a condenser lens arrangement using quadrupole distribution analogous to that currently used in UV patterning.
Figure 6B:
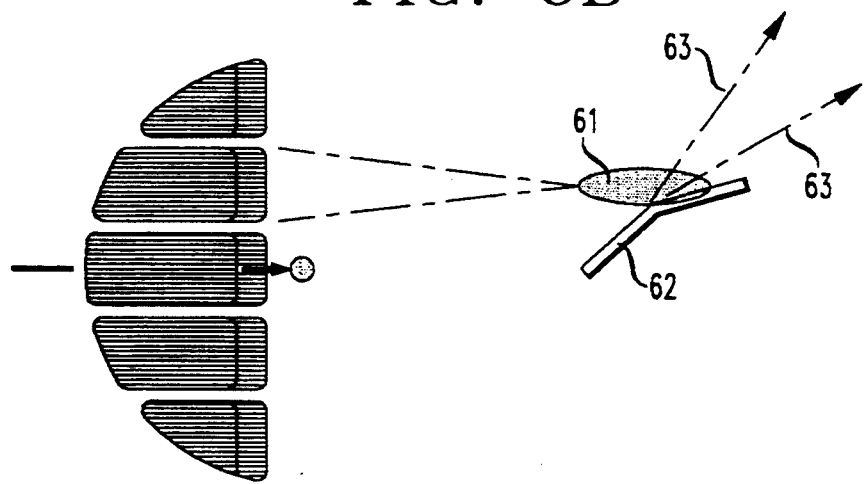
Figure 6C:
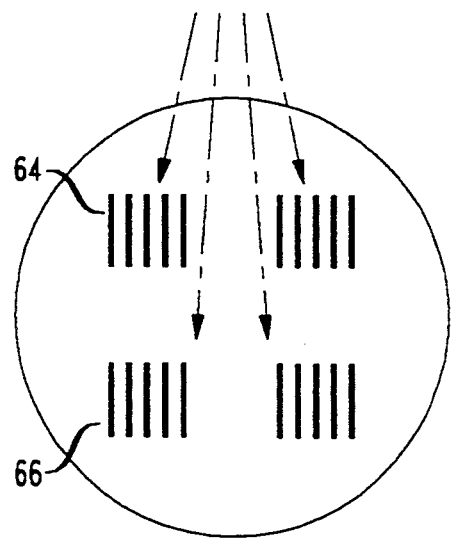

In FIG. 6a, collector facets 60 are arranged to have a quadrupole distribution, to focus into two series of spots on multi-faceted lens 61 (e.g. corresponding with lens 42 of FIG. 4). In FIG. 6b, it is seen that facets 61 are split along their length so that each consists of two facets 62, oriented at different angles to result in radiation being reflected in two slightly different directions 63 in the vertical or scanning direction. Viewed from FIG. 6c, radiation upon reaching the pupil is split into four separate multi-image fields 64, 65, 66 and 67.

FIGS. 7a–7d show various collector lens designs, always including paired complementary facets. Discrete compensating facets separate lens functions and facilitate design. Members of pairs, always producing equal and opposite intensity gradients, to, together, produce a composite image which is evenly illuminated in the compensating direction, are independently directed to suit the camera optics. Illumination in the compensating direction is at least ±15%. Careful facet placement results in ±5% or even ±1% or better.

In FIG. 7a, the lens array 70 is constituted primarily of paired facets 71a–71b. Facets 71c, positioned at the extremities of the emission sphere, are not paired. Pairing, here to, is preferred in principle, but any intensity gradients may be small enough to be ignored. In general, single-faceted mirrors over the final 65°–75° of emission in this direction are tolerable. (Consistent with usual practice, angles are measured relative to the optic axis.) As in all arrangements, members of paired facets are symmetrically placed about source 75.

In FIG. 7b, collector lens 72 is constituted of five pairs of facets 72a–72b. This arrangement may result in a somewhat smaller aspect-ratio slit than the 7-tier arrangement of FIG. 7a. The variations of FIGS. 7c and 7d are trivial. For the four-tier arrangement of facets 73a–73b, the horizontal center line of spot source 75 is naturally located at the intercept of two pairs. It is of little importance that source-to-facet spacing is different in the two dimensions—it is desirable only that each dimension spacing by symmetrical. Collector lens 74 is a three-tier array of paired facets 74a–74b. Illustrative facet aspect-ratio may be suited to a similarly shaped illumination field.

FIG. 7e is an elevational (or side) view of the arrangement of FIG. 7b, showing stacked facets 72a.

The facet arrangements shown are based on minimal facet count. The inventive requirements may be met by higher count arrangements. As an example, lateral faceting may involve four rather than two facets, providing that inner and outer pairs produce the required evenly-illuminated composite field image. Should there be reason to do it, it is required only that the entire lateral set produce such a field image (so that neither the inner nor the outer pair is completely self-compensating).

Figure 8B:
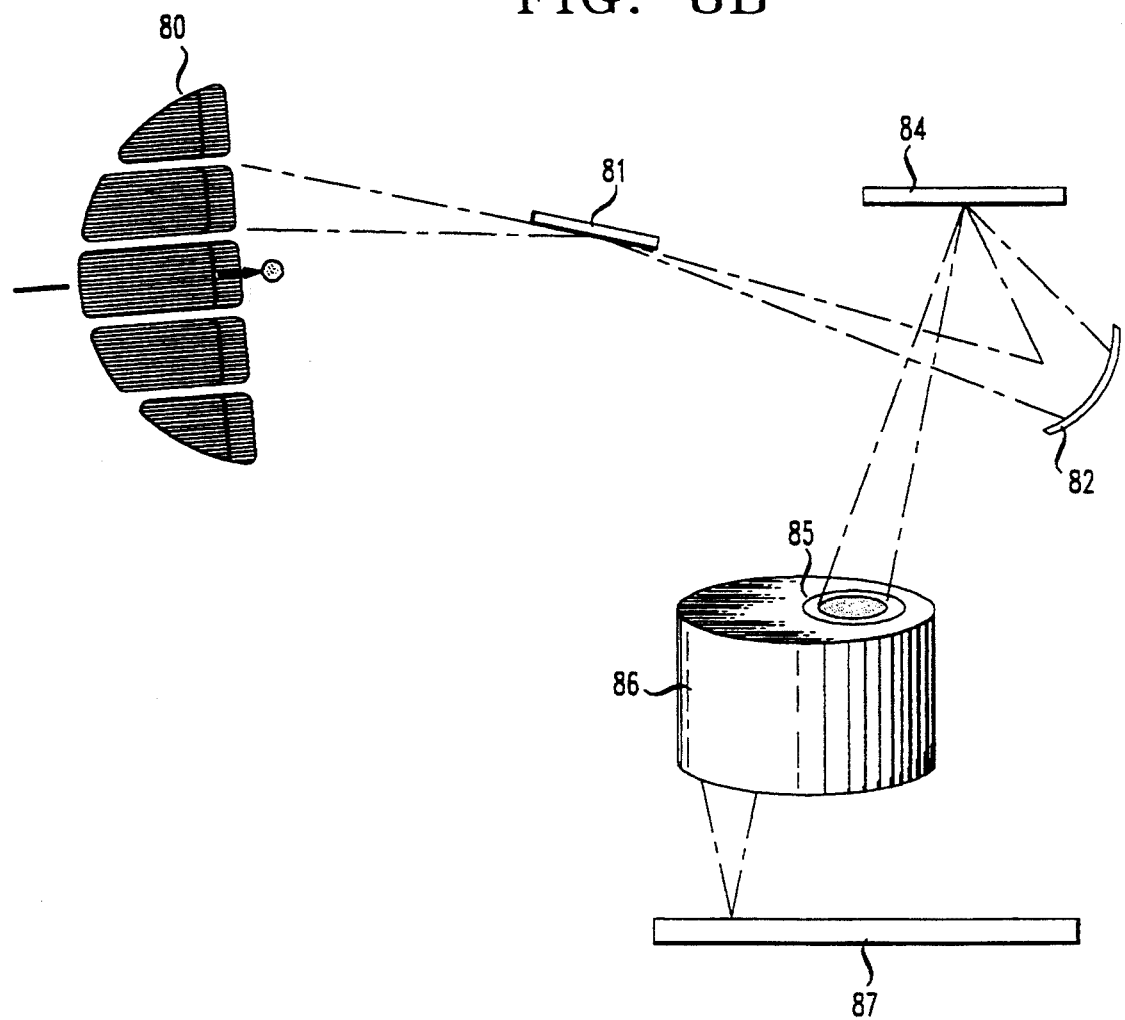

FIGS. 8a and 8b are plan and vertical views, respectively, showing a three-lens condenser system used as the basis for Example 1. Collector includes five paired facets of the arrangement shown in FIG. 7b. The facets are MLRs, consisting e.g. of 40 paired Mo-Si layers. The radiation passes through a window 88 that keeps dirt produced by the plasma from damaging the mirrors of the camera 86. The first processing lens 81, a grazing incidence multi-faceted mirror, directs the radiation to processing lens 82 which combines the functions of vertical processing lens 37 of FIG. 3, and horizontal processing lens 43 of FIG. 4. Processed radiation as leaving lens 82 produces arc-shaped illumination field 83 on mask 84, which in turn, creates an image of the arc on wafer 87 via reflection into camera pupil 85 of camera 86.

Device Fabrication—Basic device fabrication is not otherwise altered. Reference may be made to a number of texts, e.g. Simon Sze, VLSI Technology, McGraw Hill, 1983. The following examples 1 and 2 are directed to the critical window level in MOS VLSI device fabrication.

Example 1—Fabrication of a 256 mbit, 0.1 $\mu$m design rule MOS device is illustrated by fabrication at the window level as follows: The apparatus of FIGS. 8a and 8b is provided with a plasma source of 500 watt emission consisting of a 500 watt YAG laser-pumped tin source. The collector lens of the arrangement of lens 80 consists of eight 35 mm×90 mm multi-layered facets, each containing 40 pairs of successive Mo-Si layers, to result in focused beams of λ=135±3 Å of total power 2.5 watts. As received by wafer 87, the ringfield scanning line is of dimensions. 1 mm in the scanning direction and 25 mm as measured along the chord of the arcuate line.

Example 2—The x-rays projection camera is of the family designed by Jewell. (See U.S. patent application Ser. No. 07/732,559, filed Jul. 16, 1991.) It has a numerical aperture of 0.1 and is capable of printing 0.1 micron lines. In the first applications it will be used only for the critical levels, e.g. the gate and the contact windows. Other printers, e.g., deep UV, will print other levels. In later models, when the numerical aperture has been increased to 0.2, it will print critical levels with 0.05 micron features and also many other levels—the other levels will have 0.1-0.15 micron features that are too small to be printed even by Deep UV. Suppose 1 watt strikes the mask of the gate level. Due to losses in the mirrors of the camera, a thin silicon window (0.3 μm thick) between the wafer and the camera, only 75 μm (or less, depending on how much of the mask is reflective) arrive on the wafer.

The wafer has patterning from previous levels. Immediately before the lithography, the wafer was coated with a very thin oxide layer, a polysilicon conductor and on top, a thick oxide layer. An x-ray resist covers the whole wafer. The wafer is placed under the x-ray projector, aligned, and exposed. If the resist has a sensitivity of 15 mj/cm$^2$, 5 cm$^2$ will be exposed each second.

The resist is developed, and, where there is no resist, the top oxide and polysilicon layers are removed by dry etching, leaving the very thin oxide layer on the bottom intact. Later an ion beam implants dopants through the thin oxide into the silicon, forming conductive layers that act as source and drain regions. The region of silicon under the polysilicon gate remains resistive, and will conduct only when a voltage is applied to the gate.

I claim:

1. Process for fabrication of a device comprising at least one element of least dimension ≦0.25 μm, such process comprising construction of a plurality of successive levels, each level entailing lithographic delineation, in accordance with which a subject mask pattern is imaged on an image plane, ultimately to result in removal of or addition of material in delineated regions, at least one such level entailing ringfield projection lithographic delineation by use of radiation in the soft x-ray spectrum, and in which such radiation is derived from a laser-produced plasma characterized in that emission from the plasma is collected by a collector lens including at least four paired mirror facets, in which members of each pair are symmetrically disposed about an axis of the source and in which paired members individually produce complementary images of the entirely of an illumination field, whereby paired members together produce an evenly illuminated compensated field and the entire illumination field is of an intensity which is the sum of all facet-produced image fields.

2. Process of claim 1 in which the collector lens is the first lens of a condenser which includes at least one processing lens.

3. Process of claim 2 in which the condenser includes a first processing lens which is faceted, in which the number of facets in the first processing lens is equal to the number of facets in the collector lens, and in which images yielded by collector lens facets are incident upon individual dedicated facets of the first processing lens.

4. Process of claim 2 in which the one processing lens contributes to shaping of the illumination field into the arc-shaped form required for ringfield projection.

5. Process of claim 2 in which the condenser includes filter means for reducing the plasma-emitted radiation spectrum of λ=100 Å-200 Å, and in which the means consist essentially of an MLR condenser lens.

6. Process of claim 5 in which the MLR condenser lens is the collector lens.

7. Process of claim 1 in which ringfield lithographic delineation entails subject:image size reduction.

8. Process of claim 7 in which the condenser includes at least two processing lenses intermediate the collector lens and the mask, the processing lenses together functioning to direct and shape the ringfield illumination field.

9. Process of claim 8 in which member facets of at least one pair of the collector lens are curved.

10. Process of claim 9 in which the curved member facets are ellipsoidal.

11. Process of claim 10 in which the curved member facts are of Lopez curvature.

12. Process of claim 1 in which paired facet tiers are two-membered.

13. Process of claim 2 in which paired members are tilted so that illumination from the collector lens forms two separated series of images.

14. Process of claim 13 in which illumination as incident on the camera pupil is quadrupole.

15. Process of claim 2 in which the condenser includes an adjustable real aperture of adjustability sufficient to block some of the radiation.

16. Process of claim 15 in which an adjustable real aperture is positioned immediately subsequent to a first processing lens.

17. Device as produced by any of claims 1,2,3,4,5,6,7,8,9,10,11,12,13, 14,15 or 16.

* * * * *